(12) United States Patent
Chien et al.

(10) Patent No.: US 8,901,687 B2
(45) Date of Patent: Dec. 2, 2014

(54) MAGNETIC DEVICE WITH A SUBSTRATE, A SENSING BLOCK AND A REPAIR LAYER

(71) Applicant: Industrial Technology Research Institute, Hsinchu (TW)

(72) Inventors: Cheng Wei Chien, Taoyuan County (TW); Kuei Hung Shen, Hsinchu (TW); Yung Hung Wang, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/686,663

(22) Filed: Nov. 27, 2012

(65) Prior Publication Data
US 2014/0145277 A1 May 29, 2014

(51) Int. Cl.
*H01L 29/82* (2006.01)
*H01L 43/08* (2006.01)

(52) U.S. Cl.
CPC ...................................... *H01L 43/08* (2013.01)
USPC ........... 257/421; 257/422; 257/423; 257/427; 257/E29.323

(58) Field of Classification Search
USPC ........ 257/20, 414, 421–427, E29.323; 438/3; 365/157–158, 171–173; 360/324–326
See application file for complete search history.

(56) References Cited

U.S. PATENT DOCUMENTS

| | | | |
|---|---|---|---|
| 6,351,410 B1 | 2/2002 | Nakao et al. |
| 6,475,857 B1 | 11/2002 | Kim et al. |
| 6,521,931 B2 | 2/2003 | Sandhu et al. |
| 6,555,858 B1 | 4/2003 | Jones et al. |
| 6,600,638 B2 | 7/2003 | Gill |
| 6,621,730 B1 | 9/2003 | Lage |
| 6,624,987 B1 | 9/2003 | Hayashi et al. |
| 6,724,653 B1 | 4/2004 | Iwata et al. |
| 6,784,517 B2 | 8/2004 | Kleveland et al. |
| 6,795,334 B2 | 9/2004 | Iwata et al. |
| 6,798,626 B2 | 9/2004 | Hayashi et al. |
| 6,815,248 B2 | 11/2004 | Leuschner et al. |
| 6,911,156 B2 | 6/2005 | Grynkewich et al. |
| 6,912,152 B2 | 6/2005 | Iwata et al. |
| 6,914,806 B2 | 7/2005 | Kunikiyo |
| 6,916,669 B2 | 7/2005 | Jones et al. |
| 6,990,004 B2 | 1/2006 | Iwata |
| 7,009,266 B2 | 3/2006 | Shi et al. |

(Continued)

FOREIGN PATENT DOCUMENTS

WO    2013101203 A1    7/2013

OTHER PUBLICATIONS

Su Ryan Min et al., "Etch characteristics of magnetic tunnel junction stack using a high density plasma in a HBr/Ar gas," International Symposium on Advanced Magnetic Materials and Applications, 2007, pp. 4416-4420, vol. 4, No. 12.

(Continued)

*Primary Examiner* — Jami M Valentine
(74) *Attorney, Agent, or Firm* — WPAT, P.C.; Anthony King

(57) ABSTRACT

A magnetic device includes a substrate, a sensing block and a repair layer. The substrate has a registration layer and a barrier layer disposed on the registration layer. The sensing block is patterned to distribute on the barrier layer. The repair layer is disposed substantially on the barrier layer, wherein the barrier layer is configured to have a tunneling effect when a bias voltage exists between the sensing block and the registration layer.

16 Claims, 9 Drawing Sheets

(56) References Cited

U.S. PATENT DOCUMENTS

| | | | |
|---|---|---|---|
| 7,033,881 B2 | 4/2006 | Gaidis et al. | |
| 7,064,975 B2 | 6/2006 | Iwata | |
| 7,084,437 B2 | 8/2006 | Kitamura et al. | |
| 7,097,777 B2 | 8/2006 | Costrini et al. | |
| 7,141,438 B2 | 11/2006 | Ha et al. | |
| 7,164,167 B2 | 1/2007 | Iwata et al. | |
| 7,183,633 B2 | 2/2007 | Daneman et al. | |
| 7,199,055 B2 | 4/2007 | Chen et al. | |
| 7,203,084 B2 | 4/2007 | Lee et al. | |
| 7,291,878 B2 | 11/2007 | Stipe | |
| 7,319,262 B2 | 1/2008 | Liu et al. | |
| 7,352,041 B2 | 4/2008 | Horikoshi | |
| 7,368,299 B2 | 5/2008 | Lee et al. | |
| 7,372,118 B2 | 5/2008 | Asao et al. | |
| 7,463,502 B2 | 12/2008 | Stipe | |
| 7,476,954 B2 | 1/2009 | Wang et al. | |
| 7,488,648 B2 | 2/2009 | Baik | |
| 7,527,986 B1 | 5/2009 | Jung | |
| 7,528,457 B2 | 5/2009 | Horng et al. | |
| 7,541,199 B2 | 6/2009 | Bae et al. | |
| 7,554,834 B2 | 6/2009 | Wunderlich et al. | |
| 7,564,658 B2 | 7/2009 | Zhang et al. | |
| 7,579,197 B1 | 8/2009 | Li | |
| 7,582,926 B2 | 9/2009 | Iwata et al. | |
| 7,595,520 B2 | 9/2009 | Horng et al. | |
| 7,598,579 B2 | 10/2009 | Horng et al. | |
| 7,663,131 B2 | 2/2010 | Horng et al. | |
| 7,672,093 B2 | 3/2010 | Horng et al. | |
| 7,696,548 B2 | 4/2010 | Wang et al. | |
| 7,723,128 B2 | 5/2010 | Wang et al. | |
| 7,732,881 B2 | 6/2010 | Wang | |
| 7,767,469 B2 | 8/2010 | Asao et al. | |
| 7,777,261 B2 | 8/2010 | Huai et al. | |
| 7,781,231 B2 | 8/2010 | Li | |
| 7,829,963 B2 | 11/2010 | Wang et al. | |
| 7,829,964 B2 | 11/2010 | Chen et al. | |
| 7,843,718 B2 | 11/2010 | Koh et al. | |
| 7,875,958 B2 | 1/2011 | Cheng et al. | |
| 7,880,249 B2 | 2/2011 | Yuan et al. | |
| 7,910,407 B2 | 3/2011 | Scheuerlein | |
| 7,923,812 B2 | 4/2011 | Scheuerlein | |
| 7,932,572 B2 | 4/2011 | Tsujiuchi | |
| 7,936,003 B2 | 5/2011 | Kang et al. | |
| 7,936,027 B2 | 5/2011 | Xiao et al. | |
| 7,973,349 B2 | 7/2011 | Huai et al. | |
| 7,989,224 B2 | 8/2011 | Gaidis | |
| 7,999,338 B2 * | 8/2011 | Zheng et al. | 257/421 |
| 8,026,562 B2 | 9/2011 | Chen et al. | |
| 8,036,018 B2 | 10/2011 | Koh et al. | |
| 8,039,372 B2 | 10/2011 | Min et al. | |
| 8,039,885 B2 | 10/2011 | Wang et al. | |
| 8,062,909 B2 | 11/2011 | Wang et al. | |
| 8,125,040 B2 | 2/2012 | Kang et al. | |
| 8,133,809 B2 | 3/2012 | Mao | |
| 8,143,683 B2 | 3/2012 | Wang et al. | |
| 8,176,622 B2 | 5/2012 | Horng et al. | |
| 8,178,363 B2 | 5/2012 | Wang et al. | |
| 8,456,898 B2 | 6/2013 | Chen et al. | |
| 8,466,525 B2 | 6/2013 | Zheng et al. | |
| 8,470,462 B2 | 6/2013 | Horng et al. | |
| 8,492,860 B2 | 7/2013 | Zhou et al. | |
| 8,542,524 B2 | 9/2013 | Keshtbod et al. | |
| 8,604,572 B2 | 12/2013 | Wang et al. | |
| 8,697,484 B2 | 4/2014 | Apalkov et al. | |
| 8,710,602 B2 | 4/2014 | Tang et al. | |
| 2003/0022420 A1 | 1/2003 | Kleveland et al. | |
| 2003/0053332 A1 | 3/2003 | Kleveland et al. | |
| 2003/0117834 A1 | 6/2003 | Iwata et al. | |
| 2003/0123271 A1 | 7/2003 | Iwata | |
| 2003/0151079 A1 | 8/2003 | Jones et al. | |
| 2003/0151859 A1 | 8/2003 | Hayashi et al. | |
| 2003/0161197 A1 | 8/2003 | Iwata et al. | |
| 2003/0199104 A1 | 10/2003 | Leuschner et al. | |
| 2003/0223283 A1 | 12/2003 | Kunikiyo | |
| 2004/0084400 A1 | 5/2004 | Costrini et al. | |
| 2004/0087163 A1 | 5/2004 | Steimle et al. | |
| 2004/0164359 A1 | 8/2004 | Iwata et al. | |
| 2004/0175848 A1 | 9/2004 | Chen et al. | |
| 2004/0205958 A1 | 10/2004 | Grynkewich et al. | |
| 2004/0206982 A1 | 10/2004 | Lee et al. | |
| 2004/0245547 A1 | 12/2004 | Stipe | |
| 2005/0009210 A1 | 1/2005 | Hosotani | |
| 2005/0020076 A1 | 1/2005 | Lee et al. | |
| 2005/0035386 A1 | 2/2005 | Ha et al. | |
| 2005/0042825 A1 | 2/2005 | Kitamura et al. | |
| 2005/0048674 A1 | 3/2005 | Shi et al. | |
| 2005/0052938 A1 | 3/2005 | Horikoshi | |
| 2005/0083730 A1 | 4/2005 | Iwata | |
| 2005/0083731 A1 | 4/2005 | Iwata | |
| 2005/0083734 A1 | 4/2005 | Iwata | |
| 2005/0106509 A1 | 5/2005 | Chang et al. | |
| 2005/0207064 A1 | 9/2005 | Costrini et al. | |
| 2005/0274997 A1 | 12/2005 | Gaidis et al. | |
| 2005/0285183 A1 | 12/2005 | Baik | |
| 2006/0014305 A1 | 1/2006 | Lee et al. | |
| 2006/0033136 A1 | 2/2006 | Liu et al. | |
| 2006/0049826 A1 | 3/2006 | Daneman et al. | |
| 2006/0054947 A1 | 3/2006 | Asao et al. | |
| 2006/0061915 A1 | 3/2006 | Zhang et al. | |
| 2006/0081941 A1 | 4/2006 | Iwata et al. | |
| 2006/0131629 A1 | 6/2006 | Fukuzumi et al. | |
| 2006/0170031 A1 | 8/2006 | Kang et al. | |
| 2006/0215442 A1 | 9/2006 | Wunderlich et al. | |
| 2006/0246604 A1 | 11/2006 | Bae et al. | |
| 2007/0034919 A1 | 2/2007 | Wang et al. | |
| 2007/0041125 A1 | 2/2007 | Ha et al. | |
| 2007/0063236 A1 | 3/2007 | Huai et al. | |
| 2007/0063237 A1 | 3/2007 | Huai et al. | |
| 2007/0120210 A1 | 5/2007 | Yuan et al. | |
| 2008/0029754 A1 | 2/2008 | Min et al. | |
| 2008/0037349 A1 | 2/2008 | Stipe | |
| 2008/0073641 A1 | 3/2008 | Cheng et al. | |
| 2008/0206895 A1 | 8/2008 | Asao et al. | |
| 2008/0241598 A1 | 10/2008 | Fukuzumi et al. | |
| 2009/0027955 A1 | 1/2009 | Koh et al. | |
| 2009/0108383 A1 | 4/2009 | Horng et al. | |
| 2009/0130779 A1 | 5/2009 | Li et al. | |
| 2009/0159562 A1 | 6/2009 | Cho et al. | |
| 2009/0159563 A1 | 6/2009 | Jung | |
| 2009/0173977 A1 | 7/2009 | Xiao et al. | |
| 2009/0206425 A1 | 8/2009 | Tsujiuchi | |
| 2009/0209050 A1 | 8/2009 | Wang et al. | |
| 2009/0224341 A1 | 9/2009 | Li | |
| 2009/0227045 A1 | 9/2009 | Li | |
| 2009/0230445 A1 | 9/2009 | Bae et al. | |
| 2009/0261434 A1 | 10/2009 | Kang et al. | |
| 2010/0072528 A1 | 3/2010 | Inokuchi et al. | |
| 2010/0072566 A1 | 3/2010 | Kang et al. | |
| 2010/0136713 A1 | 6/2010 | Horng et al. | |
| 2010/0155689 A1 | 6/2010 | Scheuerlein | |
| 2010/0157653 A1 | 6/2010 | Scheuerlein | |
| 2010/0176429 A1 | 7/2010 | Wang et al. | |
| 2010/0178715 A1 | 7/2010 | Wang et al. | |
| 2010/0193891 A1 | 8/2010 | Wang et al. | |
| 2010/0200899 A1 | 8/2010 | Marukame et al. | |
| 2010/0219493 A1 | 9/2010 | Li | |
| 2010/0237448 A1 | 9/2010 | Shin | |
| 2010/0301480 A1 | 12/2010 | Choi et al. | |
| 2011/0044093 A1 | 2/2011 | Koh et al. | |
| 2011/0044096 A1 | 2/2011 | Li | |
| 2011/0049654 A1 | 3/2011 | Li et al. | |
| 2011/0049656 A1 | 3/2011 | Li et al. | |
| 2011/0057275 A1 | 3/2011 | Tsujiuchi et al. | |
| 2011/0086498 A1 | 4/2011 | Cheng et al. | |
| 2011/0102948 A1 * | 5/2011 | Apalkov et al. | 360/324.2 |
| 2011/0117677 A1 | 5/2011 | Yuan et al. | |
| 2011/0121417 A1 | 5/2011 | Li et al. | |
| 2011/0127483 A1 | 6/2011 | Sonehara | |
| 2011/0140070 A1 | 6/2011 | Kim | |
| 2011/0156182 A1 | 6/2011 | Takeuchi et al. | |
| 2011/0163401 A1 | 7/2011 | Tsujiuchi | |
| 2011/0175153 A1 | 7/2011 | Kang et al. | |
| 2011/0189851 A1 | 8/2011 | Jeong et al. | |
| 2011/0198314 A1 | 8/2011 | Wang et al. | |

(56) References Cited

U.S. PATENT DOCUMENTS

| | | |
|---|---|---|
| 2011/0198715 A1 | 8/2011 | Matsuoka et al. |
| 2011/0201212 A1 | 8/2011 | Yamamoto et al. |
| 2011/0216447 A1 | 9/2011 | Li et al. |
| 2011/0233696 A1 | 9/2011 | Li |
| 2011/0233697 A1 | 9/2011 | Kajiyama |
| 2011/0235217 A1 | 9/2011 | Chen et al. |
| 2011/0272380 A1 | 11/2011 | Jeong et al. |
| 2011/0293967 A1 | 12/2011 | Zhang et al. |
| 2012/0007196 A1 | 1/2012 | Natori et al. |
| 2012/0007212 A1 | 1/2012 | Seo et al. |
| 2012/0008367 A1 | 1/2012 | Kajiyama |
| 2012/0028373 A1 | 2/2012 | Belen et al. |
| 2012/0040531 A1 | 2/2012 | Mao |
| 2012/0043630 A1 | 2/2012 | Omori et al. |
| 2012/0058574 A1 | 3/2012 | Wang et al. |
| 2012/0068286 A1 | 3/2012 | Hosotani et al. |
| 2012/0086065 A1 | 4/2012 | Kim et al. |
| 2012/0086074 A1 | 4/2012 | Hwang et al. |
| 2012/0086089 A1 | 4/2012 | Li et al. |
| 2012/0098072 A1 | 4/2012 | Han et al. |
| 2012/0119286 A1 | 5/2012 | Kim et al. |
| 2013/0015542 A1 | 1/2013 | Wang et al. |
| 2013/0059168 A1 | 3/2013 | Tahmasebi et al. |
| 2013/0207209 A1 | 8/2013 | Wang et al. |
| 2013/0334631 A1 | 12/2013 | Kinney et al. |
| 2014/0001585 A1 | 1/2014 | Dimitrov et al. |
| 2014/0022839 A1 | 1/2014 | Park et al. |
| 2014/0056061 A1* | 2/2014 | Khvalkovskiy et al. ...... 365/158 |
| 2014/0084398 A1 | 3/2014 | Oguz et al. |

OTHER PUBLICATIONS

Eun Ho Kim et al., "Evolution of Etch profile of magnetic tunnel junction stacks etched in a CH3OH/Ar plasma," Journal of the Electrochemical Society, 2012, pp. H230-H234, vol. 159, No. 3.

Young Soo Song et al., "Influence of wet chemical cleaning on properties of magnetic tunnel junction stack for magnetic RAM", Electrochemical and Solid-State Letters, 2004, pp. C64-C66, vol. 7, No. 5.

Eun Ho Kim et al., "Investigation on etch characteristics of nanometer-sized magnetic tunnel junction stacks using a HBr/Ar plasma", Journal of Nanoscience and Nanotechnology, Jul. 2011, pp. 6616-6620, vol. 11, No. 7.

J.M. Pomeroy et al., "Magnetic switching fluctuations from sidewall oxides in MgO/FeCoB magnetic tunnel junctions", Applied Physics Letters, Aug. 29, 2011, vol. 99, No. 9.

* cited by examiner

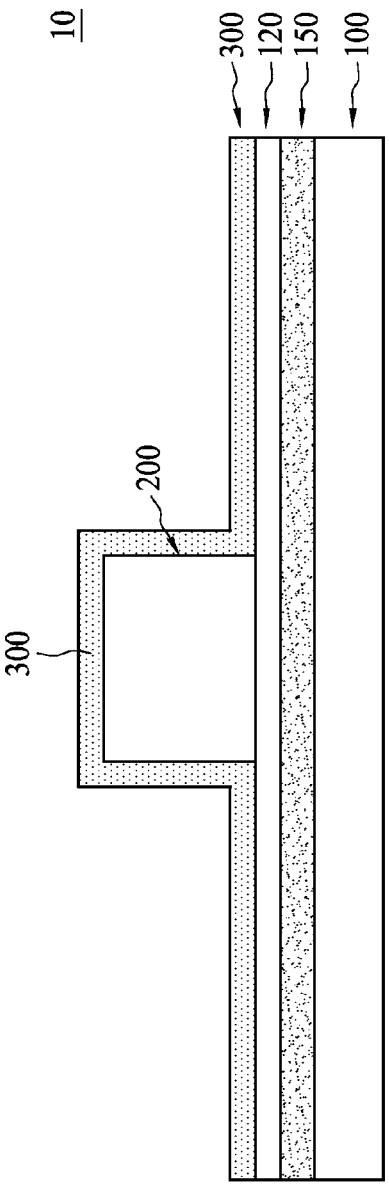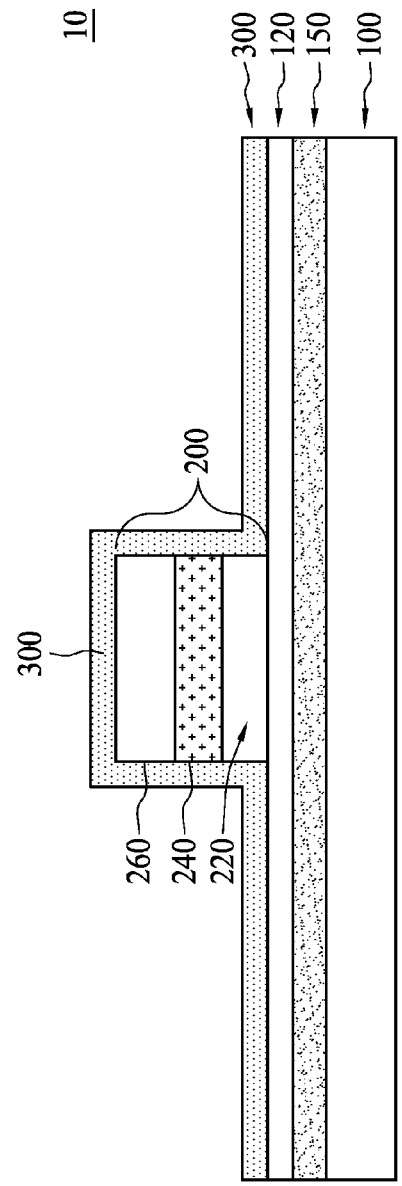

US 8,901,687 B2

MAGNETIC DEVICE WITH A SUBSTRATE, A SENSING BLOCK AND A REPAIR LAYER

FIELD OF THE INVENTION

The present disclosure generally relates to a magnetic device, and particularly to a memory storage device that uses a magnetic moment to store data.

BACKGROUND

Ferromagnetic material is utilized to manufacture a non-volatile memory device, such as magnetoresistive RAM (MRAM). Since its discovery in 1970, the tunneling effect of the magnetic tunnel junction (MTJ) has caused a dramatic change in the use of magnetic memory devices. The MTJ usually consists of at least three layers, which are the pinned layer, the barrier layer and the free layer. As a result, the stored memory in the domain can be written or read by sensing the current tunneling through the barrier.

The correctivity or the ratio of the self spin-polarization is one of the major concerns regarding the efficiency and accuracy of when to read or write the memory storage domain. One possible reason for the degraded performance is attributed to the damage on the film during manufacturing. Etching or plasma bombardments attacking the exposure surface during the process or oxidation of the post-etched film surface are probable factors. It was reported that even introducing a cap layer, such as silicon nitride, on the device right after the etching process would cause degradation. Therefore, in order to improve the performance of a magnetic memory device, the process of repairing the damage or reducing the oxidation of the device is essential.

SUMMARY OF THE INVENTION

The objective of the present disclosure is to provide a magnetic device including a substrate, a sensing block and a repair layer. The substrate has a registration layer and a barrier layer disposed on the registration layer. The sensing block is patterned to distribute on the barrier layer. The repair layer is disposed on the barrier layer and the registration layer is configured to store data.

The objective of another embodiment of the present disclosure is to provide a racetrack magnetic memory device including a substrate, a sensing block and a repair layer. The substrate has a registration layer and a barrier layer disposed on the registration layer. The sensing block is patterned to distribute on the barrier layer. The repair layer is disposed on the barrier layer and the registration layer is configured to store data.

BRIEF DESCRIPTION OF THE DRAWINGS

The invention will be described according to the appended drawings in which:

FIG. 1 illustrates a magnetic device according to the present disclosure;

FIG. 2A-B illustrates other magnetic devices according to the present disclosure;

DETAILED DESCRIPTION OF THE INVENTION

Figure 2B:
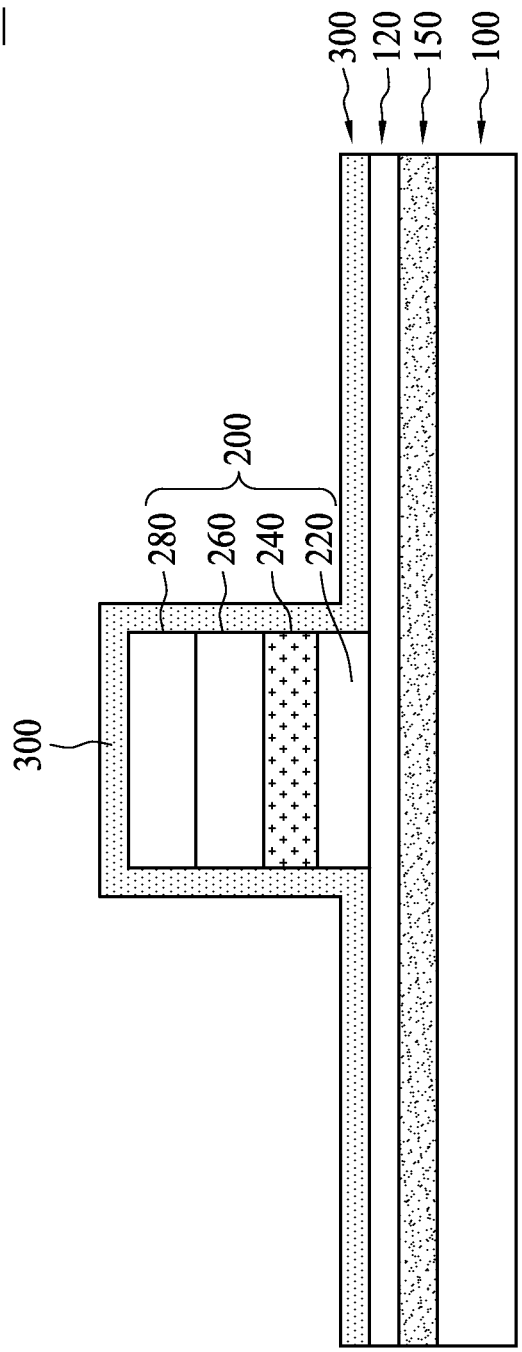

The embodiments of the present invention are described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. As used herein, the term "or" is an inclusive "or" operator, and is equivalent to the term "and/or," unless the context clearly dictates otherwise. In addition, throughout the specification, the meaning of "a," "an," and "the" include plural references. The term "coupled" implies that the elements may be directly connected together or may be coupled through one or more intervening elements.

The first embodiment according to the present disclosure can be referred to FIG. 1. A magnetic device 10 has a substrate 100, a sensing block 200 and a repair layer 300. The sensing block 200 is disposed above the substrate 100. In another embodiment, there are a plurality of sensing blocks 200 disposed on the substrate 100. The sensing block 200 can be a multi-layered film stack and the sequence of the stacking films is not limited as the illustrated embodiments. As shown in FIG. 2A, a multi-layered stack sensing block 200 includes at least three different thin film layers; there are a first ferromagnetic layer 220 on a barrier layer 120, a non-magnetic layer 240 disposed on the first ferromagnetic layer 220, and a second ferromagnetic layer 260 on the non-magnetic layer 240. A fixed layer is shown collectively as layers 220-260 in FIG. 2A which comprises a synthetic anti-ferromagnetic (SAF) structure. The non-magnetic metal layer 240 can be a metal layer and made with material such as Ruthenium (Ru), Rhodium (Rh) and Copper (Cu). The first ferromagnetic layer 220 is made of any ferromagnetic materials with perpendicular magnetic anisotropy (PMA) such as (Co/Ni)x, (Co/Pt)x, (Co/Pd)x multilayers with a CoFeB layer between 120 and 220 layer or only a single CoFeB layer. The second ferromagnetic layer 260 is made of any ferromagnetic materials with PMA such as (Co/Ni)y, (Co/Pt)y, (Co/Pd)y multilayers or a single CoFeB layer. The layers repeat numbers of x and y can be tuned to minimize the stray field generated from the unbalance SAF structure. Moreover, a registration layer 150 is disposed on the substrate 100. The barrier layer 120 is sandwiched between the registration layer 150 and the sensing block 200. In an embodiment, the barrier layer 120 is between the registration layer 150 and the first ferromagnetic layer 220. The registration layer 150 is made with ferromagnetic materials with PMA such as (Co/Ni), (Co/Pt), (Co/Pd) multilayers or a single CoFeB layer. The registration layer 150 can be optionally used to store memory according to the injected electric current from a write line (not shown) which electrically connected to the registration layer 150. The barrier layer 120 is made with electric insulating material, such as AlOx, MgxOy, etc. The thickness of the barrier layer 120 is around 10 A so as to have electrons tunneling through the barrier layer 120 if a bias voltage is applied between the registration layer 150 and the sensing block 200. The repair layer 300 is disposed on the barrier layer 120.

As shown in FIG. 2B, the multi-layered stack sensing block 200 includes at least four different thin film layers; there are a first ferromagnetic layer 220 on a barrier layer 120, a non-magnetic layer 240 disposed on the first ferromagnetic layer 220, a second ferromagnetic layer 260 on the non-magnetic layer 240, and an anti-ferromagnetic layer 280 on the second ferromagnetic layer 260. A fixed layer is shown collectively as layers 220-280 in FIG. 2B which comprises a synthetic anti-ferromagnetic (SAF) structure. The non-magnetic metal layer 240 can be a metal layer and made with material such as Ru, Rh, Cu, etc. The first ferromagnetic layer 220 and the second ferromagnetic layer 260 is made of any ferromagnetic material with in-plane magnetic anisotropy (IMA) such as CoFe, CoFeB or bilayer of CoFe/CoFeB. The anti-ferromagnetic layer 280 can be made with material such as PtMn, IrMn, NiMn, etc.

Figure 3:
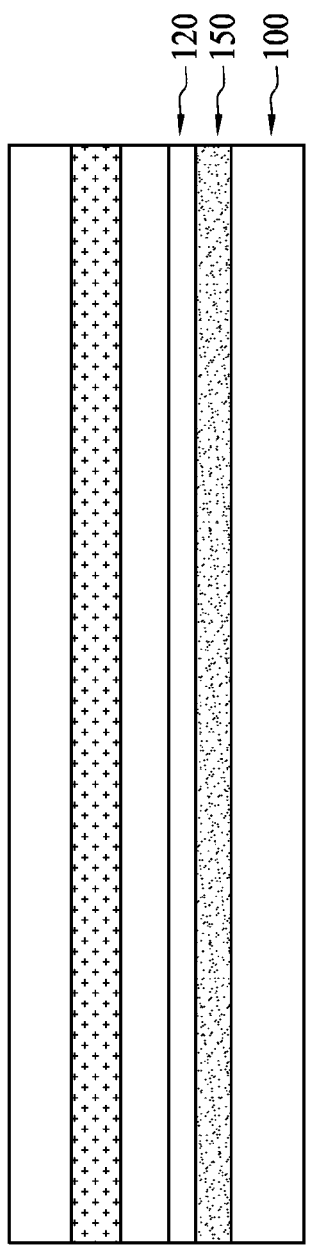
FIGS. 3-6 depict the process to manufacture an embodiment according to the present disclosure.
Figure 4:
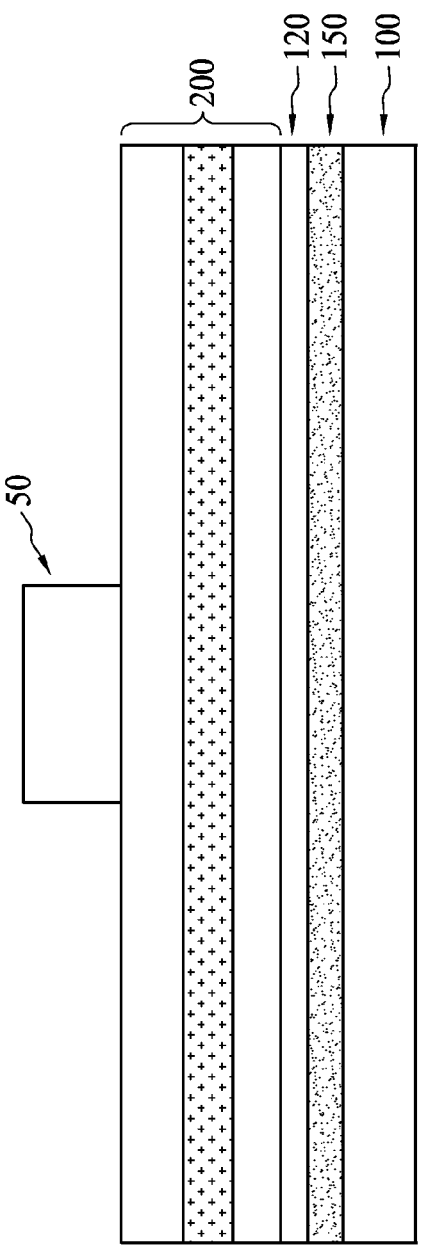
Figure 5A:
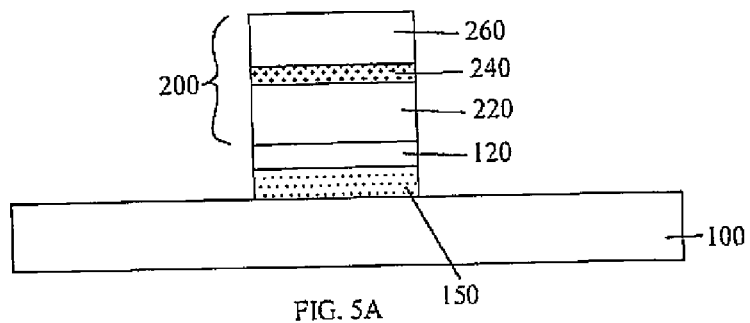
Figure 5:
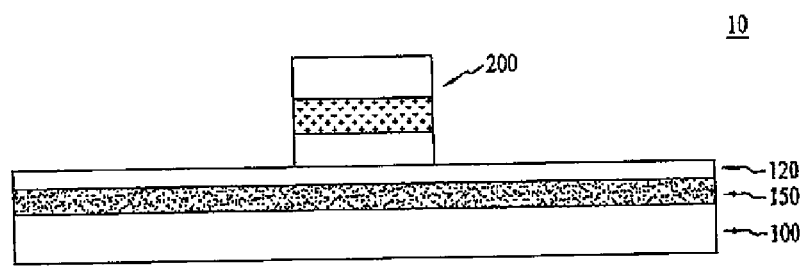
Figure 6A:
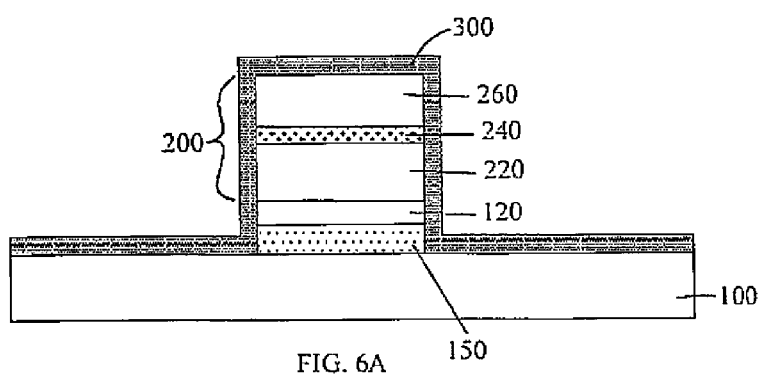
Figure 6:
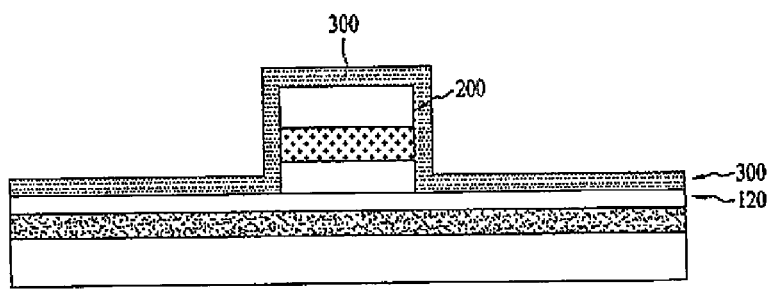

The process of manufacturing the magnetic device 10 can be accomplished in various ways in accordance to each user's preference. In one embodiment according to the present disclosure, thin film deposition such as PVD, CVD, etc. is utilized to form the registration layer 150, the barrier layer 120 and the films constructing the sensing block stack 200 in different steps. As shown in FIG. 3, the aforementioned films are blanket deposited sequentially on the substrate 100. A mask step (mask 50) is arranged on the top of the film stack as shown in FIG. 4. The mask step is followed by an etching step, preferred as a dry etch in the present embodiment. In some embodiments as in FIG. 5A, some portions of the registration layer 150 and the barrier layer 120 without coverage of the mask 50 are also etched. In some embodiments, a portion of the sensing block 200 is carved out and finally a desired pattern forms as shown in FIG. 5. The sensing block 200 can act as a terminal to read out the data if there is any current tunneling from the registration layer 150 into the sensing block 200, reversely, the registration layer 150 also can act as a terminal to read out the data if there is any current tunneling from the sensing block 200 into the registration layer 150. The repair layer 300 can form subsequently after the etching step is accomplished. In some embodiments as in FIG. 6A, the repair layer 300 is disposed conformal to the substrate 100, the registration layer 150, the barrier layer 120 and the sensing block 200. In some embodiments, the repair layer 300 is preferably disposed on the barrier layer 120 with a thin film deposition process as shown in FIG. 6.

The material which is selected to form the repair layer 300 may possess a standard oxidation potential value, $E_r$, which is greater than the standard oxidation potential value of the registration layer 150, $E_b$. In an exemplary embodiment, the oxidation potential value, $E_r$, of the repair layer is greater than 0.44V.

In another example, the material for the repair layer 300 can be metal and is preferably selected from Mg, Al, Ti, Mn, Zn, Cr, Ta, or the combination thereof, resulting in the oxygen concentration in the barrier layer 120 to be lowered after coming in contact with the repair layer 300.

In another embodiment, the alloy of Mg, Al, Ti, Mn, Zn, Cr, or Ta is used to form the repair layer. Moreover, metal oxide is also an option to form the repair layer. In one embodiment, all possible oxidation states of the following metals: Mg, Al, Ti, Mn, Zn, Cr, Ta, or the combination thereof can be chosen to achieve the same objective of the present disclosure.

Figure 7:
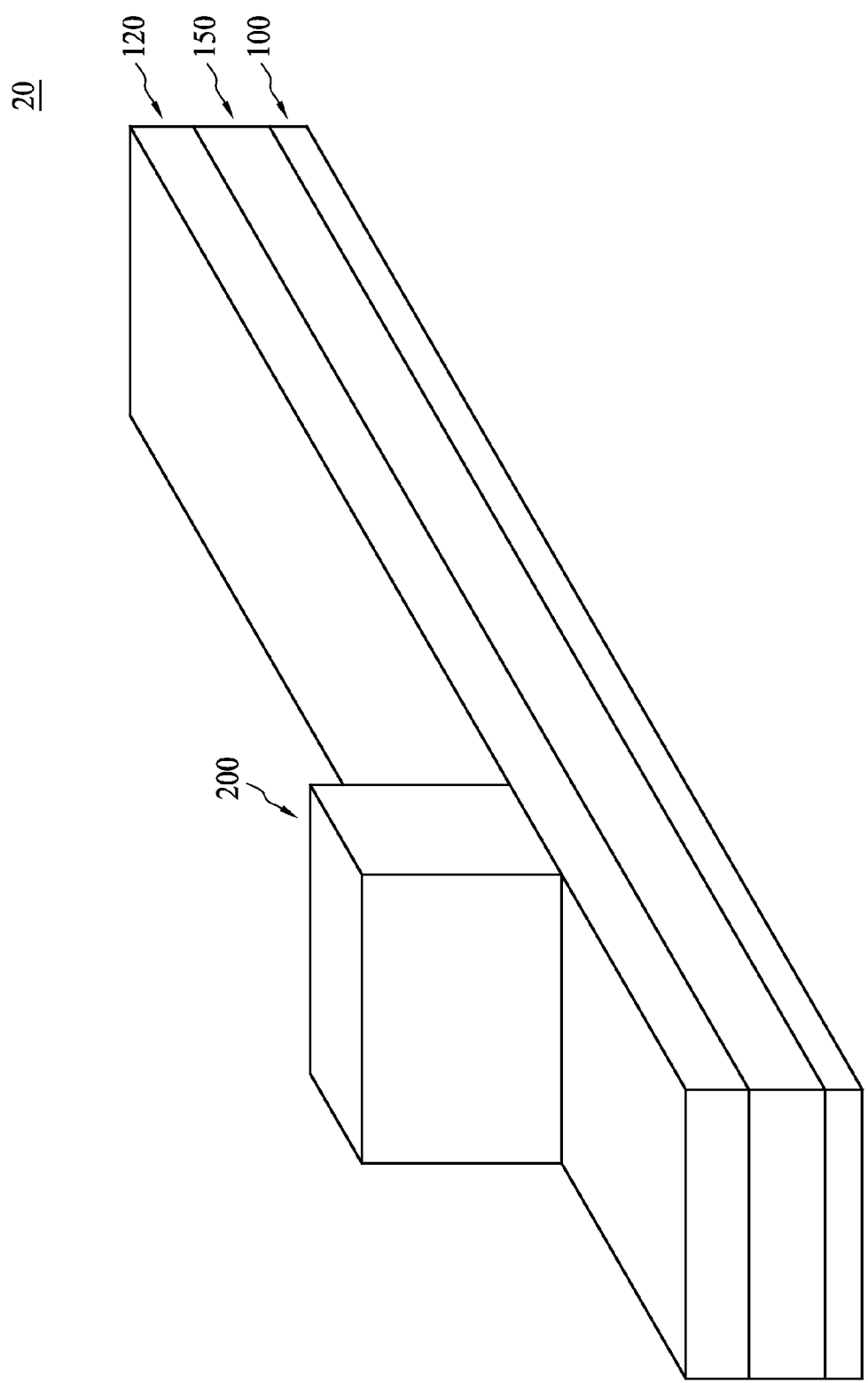
FIG. 7 illustrates a racetrack magnetic memory device according to the present disclosure.

FIG. 7 depicts another embodiment according to the present disclosure. A racetrack magnetic memory device 20 has a substrate 100, a registration layer 150 disposed on the substrate 100, and a barrier layer 120 disposed on the registration layer 150. A sensing block 200 is disposed on the barrier layer 120. In another embodiment, there is a plurality of sensing blocks 200 disposed on the barrier layer 120. The sensing block 200 can be a multi-layered film stack or a single layer structure. The registration layer 150 and the barrier layer 120 are etched to be like a racetrack.

Figure 8A:
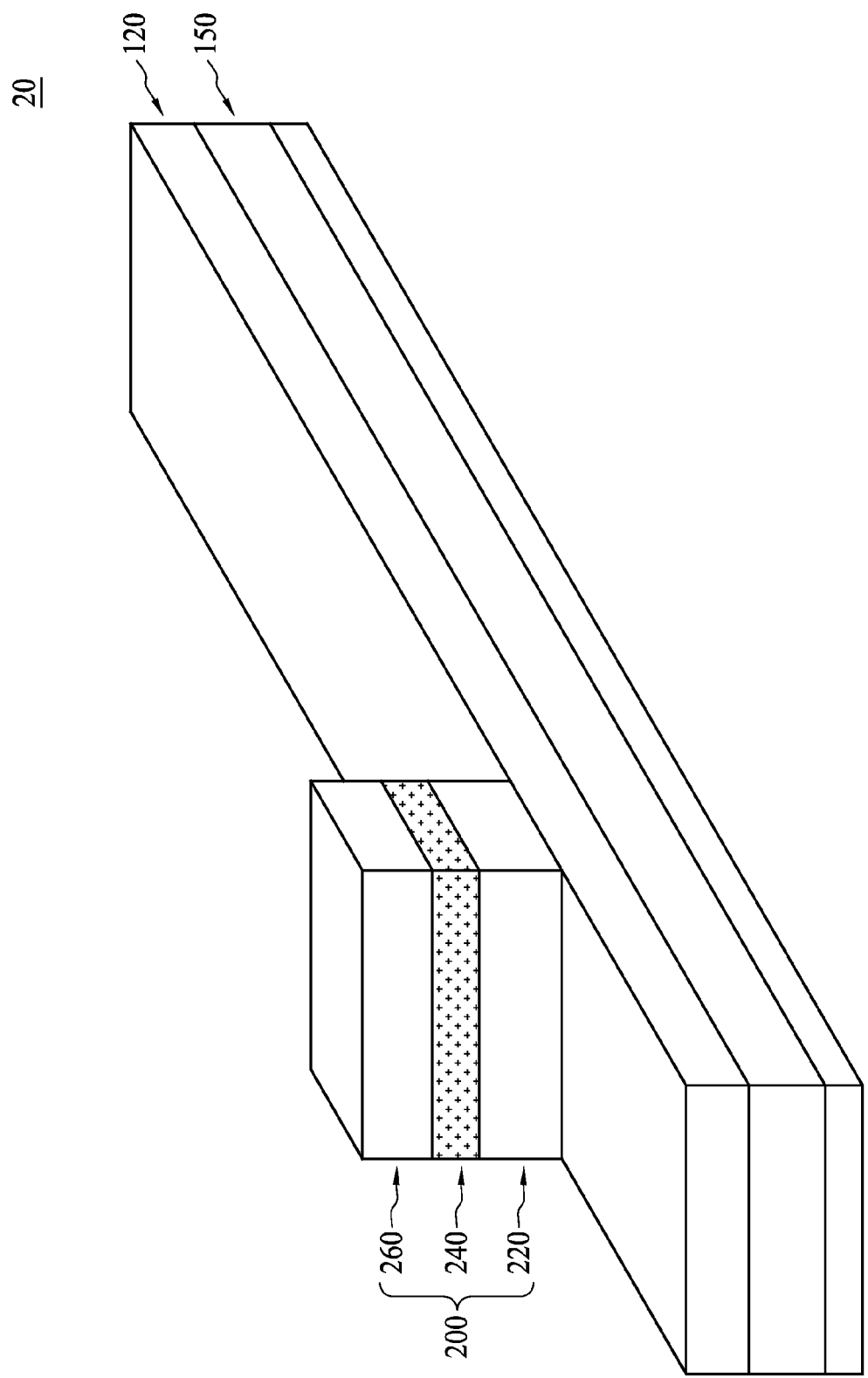
FIG. 8A-8B illustrate racetrack magnetic memory devices having a multi-layered stack sensing block.

As shown in FIG. 8A, a multi-layered stack sensing block 200 includes at least three different thin film layers; there are a first ferromagnetic layer 220 on a barrier layer 120, a non-magnetic layer 240 disposed on the first ferromagnetic layer 220, and a second ferromagnetic layer 260 on the non-magnetic metal layer 240. A fixed layer is shown collectively as layers 220-260 in FIG. 8A which comprises a synthetic anti-ferromagnetic (SAF) structure. The non-magnetic metal layer 240 can be a metal layer and made with material such as Ruthenium (Ru), Rhodium (Rh) and Copper (Cu). The first ferromagnetic layer 220 is made of any ferromagnetic materials with perpendicular magnetic anisotropy (PMA) such as (Co/Ni)x, (Co/Pt)x, (Co/Pd)x multilayers with a CoFeB layer between 120 and 220 layer or only a single CoFeB layer. The second ferromagnetic layer 260 is made of any ferromagnetic materials with PMA such as (Co/Ni)y, (Co/Pt)y, (Co/Pd)y multilayers or a single CoFeB layer. The layers repeat numbers of x and y can be tuned to minimize the stray field generated from the unbalance SAF structure. Moreover, a registration layer 150 is disposed on the substrate 100. The barrier layer 120 is sandwiched between the registration layer 150 and the sensing block 200. In an embodiment, the barrier layer 120 is between the registration layer 150 and the first ferromagnetic layer 220. The registration layer 150 is made with ferromagnetic materials with PMA such as (Co/Ni), (Co/Pt), (Co/Pd) multilayers or a single CoFeB layer. The registration layer 150 can be optionally used to store memory according to the injected electric current from a write line (not shown) which electrically connected to the registration layer 150. The barrier layer 120 is made with electric insulating material, such as AlOx, MgxOy, etc. The thickness of the barrier layer 120 is around 10 A so as to have electrons tunneling through the barrier layer 120 if a bias voltage is applied between the registration layer 150 and the sensing block 200.

Figure 8B:
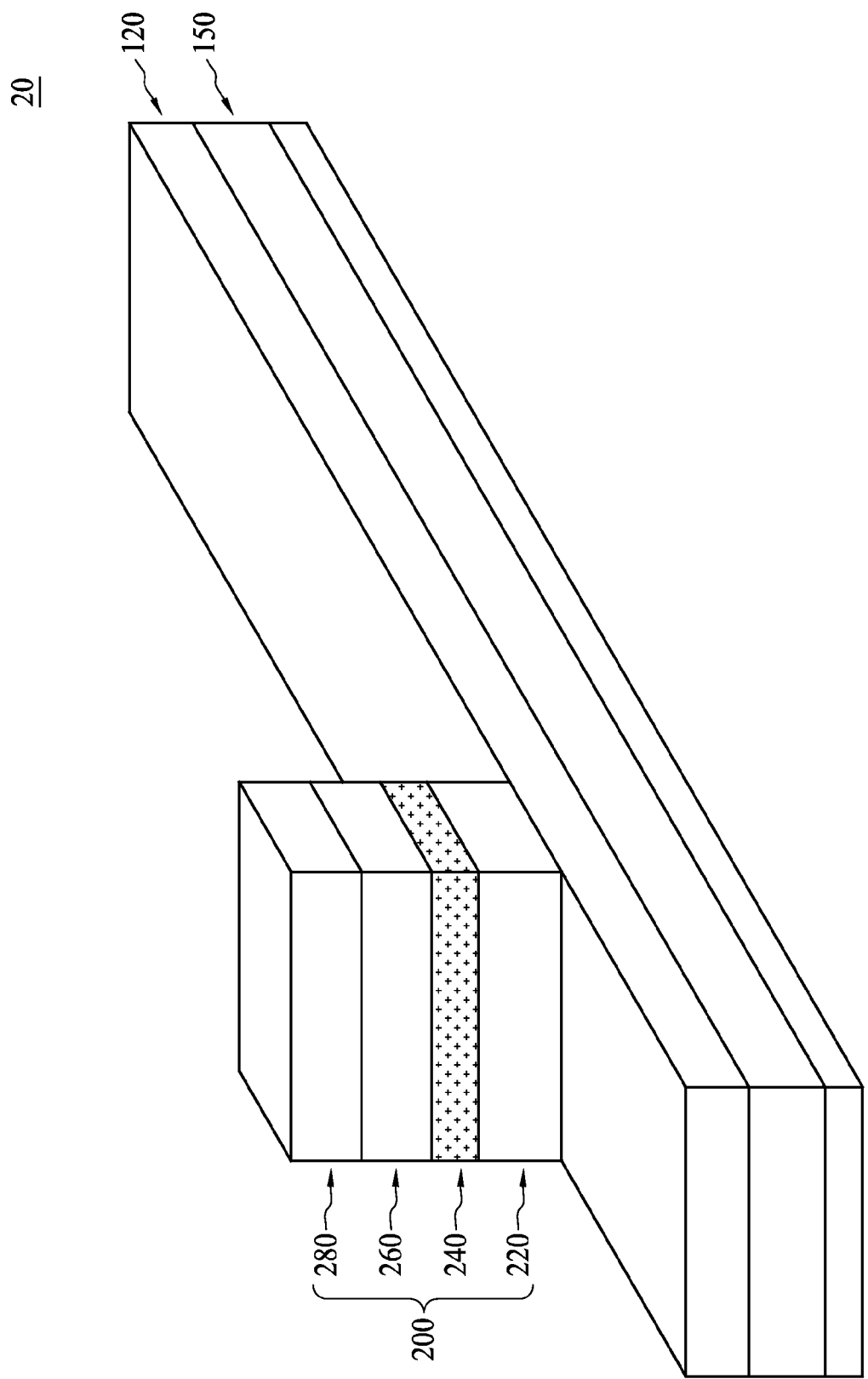

FIG. 8B illustrated another racetrack magnetic memory device according to the present disclosure. There are four different thin film layers, a first ferromagnetic layer 220 on a barrier layer 120, a non-magnetic layer 240 disposed on the first ferromagnetic layer 220, a second ferromagnetic layer 260 on the non-magnetic layer 240, and an anti-ferromagnetic layer 280 on the second ferromagnetic layer 260. A fixed layer is shown collectively as layers 220-280 in FIG. 8B which comprises a synthetic anti-ferromagnetic (SAF) structure. The non-magnetic metal layer 240 can be a metal layer and made with material such as Ru, Rh, Cu, etc. The first ferromagnetic layer 220 and the second ferromagnetic layer 260 is made of any ferromagnetic material with in-plane magnetic anisotropy (IMA) such as CoFe, CoFeB or bilayer of CoFe/CoFeB. The anti-ferromagnetic layer 280 can be made with material such as PtMn, IrMn, NiMn, etc.

The process to manufacture the racetrack magnetic memory device 20 adopts similar steps as utilized for the magnetic device 10. The differences may be a different mask or few more steps that are required in order to form the racetrack memory. For example, an etching step may be provided to carve out a portion of each blanket film for the registration layer 150 and the barrier layer 120 to form a racetrack.

Figure 9A:
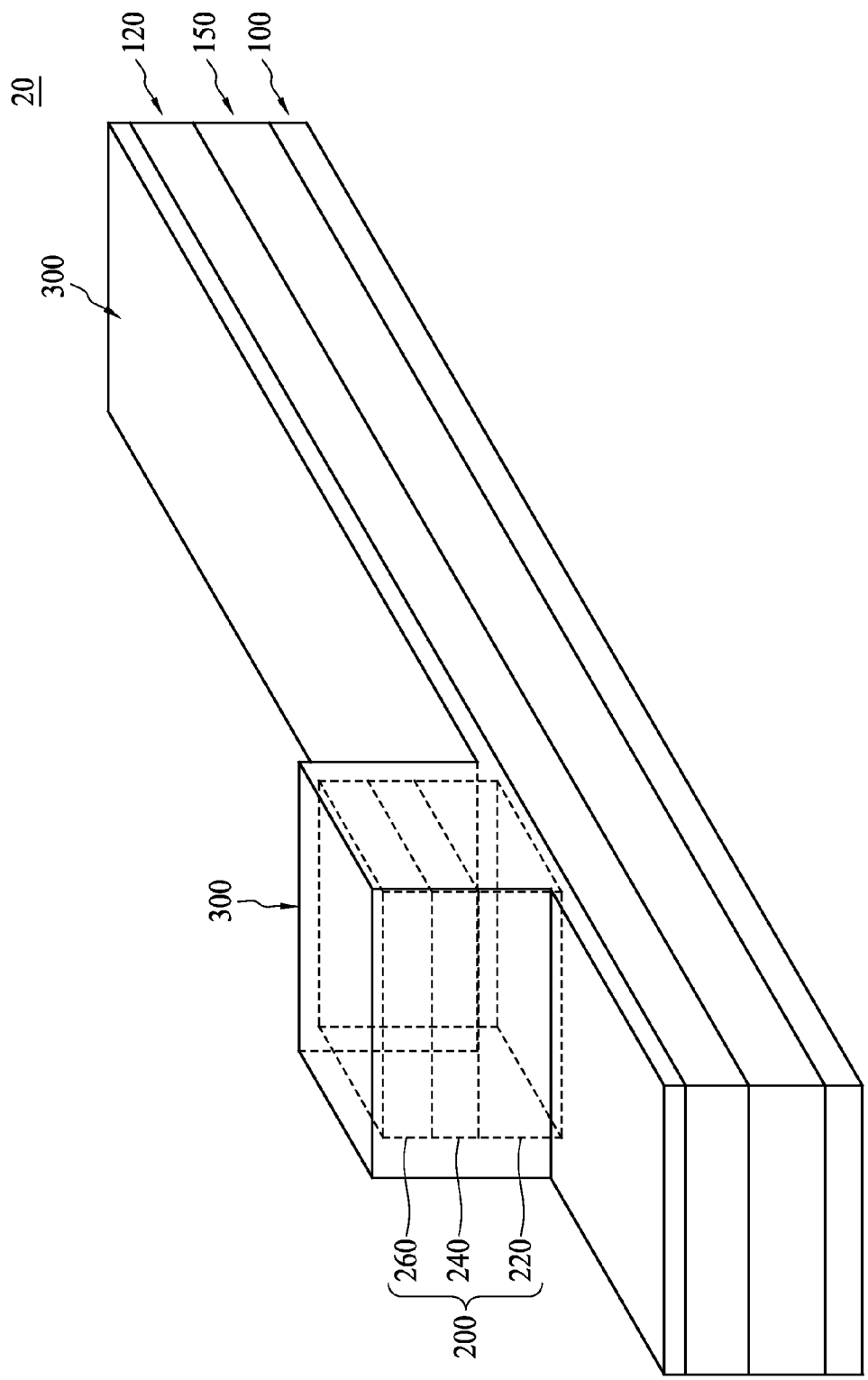
FIG. 9A-B illustrate racetrack magnetic memory devices having a repair layer.
Figure 9B:
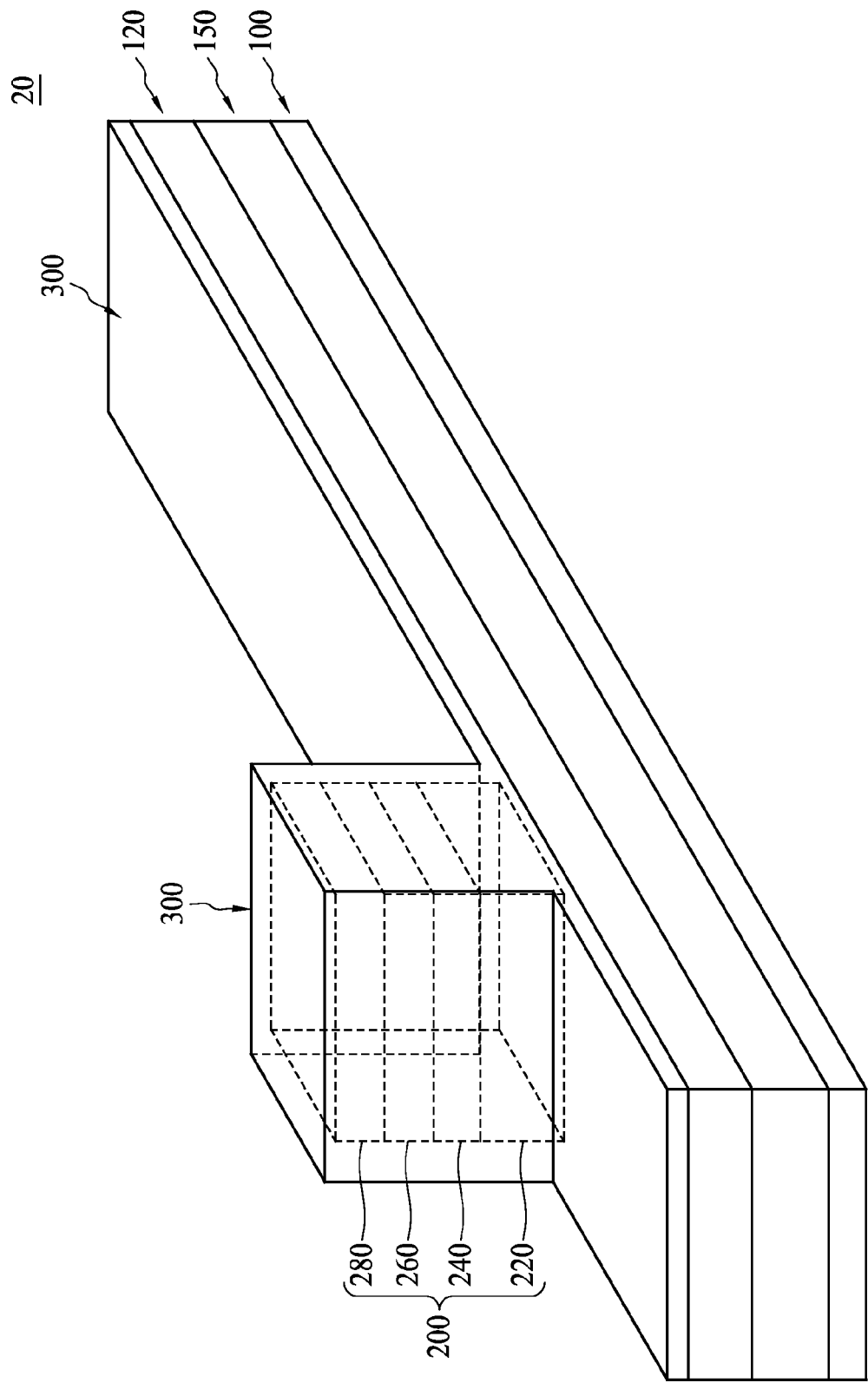

FIGS. 9A and 9B respectively shows the deposition of a repair layer 300 on the barrier layer 120 as illustrated in FIGS. 8A and 8B. The material which is selected to form the repair layer 300 may possess a standard oxidation potential value, $E_r$, which is greater than the standard oxidation potential value of the registration layer 150, $E_b$. In an exemplary embodiment, the oxidation potential value, $E_r$, of the repair layer is greater than 0.44V.

In another example, the material for the repair layer 300 can be metal and is preferably selected from Mg, Al, Ti, Mn, Zn, Cr, Ta, or the combination thereof, resulting in the oxygen concentration in the barrier layer 120 to be lowered after coming in contact with the repair layer 300.

In another embodiment, the alloy of Mg, Al, Ti, Mn, Zn, Cr, or Ta is used to form the repair layer. Moreover, metal oxide is also an option to form the repair layer. In one embodiment, all possible oxidation states of the following metals: Mg, Al, Ti, Mn, Zn, Cr, Ta, or the combination thereof can be chosen to achieve the same objective of the present disclosure.

The methods and features of this invention have been sufficiently described in the above examples and descriptions. It should be understood that any modifications or changes without departing from the spirit of the invention are intended to be covered in the protection scope of the invention.

What is claimed is:

1. A magnetic device, comprising:
    a substrate, comprising:
        a registration layer configured to store data; and
        a barrier layer disposed on the registration layer;
    a sensing block which is patterned to be distributed on the barrier layer of the substrate; and
    a repair layer disposed conformal to the substrate and the sensing block;
    wherein the barrier layer of the substrate is configured to have a tunneling effect when a bias voltage exists between the sensing block and the registration layer, and the oxygen concentration in the barrier layer is lowered after coming in contact with the repair layer,
    wherein the repair layer comprises metal oxide.

2. The magnetic device of claim 1, wherein the repair layer is a multiple-layered structure.

3. The magnetic device of claim 1, wherein the registration layer possesses a standard oxidation potential value, $E_b$, and the repair layer possesses a standard oxidation potential value, $E_r$, wherein $E_r$ is greater than $E_b$.

4. The magnetic device of claim 3, wherein $E_r$ is greater than 0.44 volt.

5. The magnetic device of claim 1, wherein the repair layer comprises metal or metal alloy.

6. The magnetic device of claim 5, wherein the repair layer comprises Mg, Al, Ti, Mn, Zn, Cr, Ta, or the combination thereof.

7. The magnetic device of claim 1, wherein the metal oxide comprises all possible oxidation states of the following metals: Mg, Al, Ti, Mn, Zn, Cr, Ta, or the combination thereof.

8. The magnetic device of claim 1, wherein the sensing block comprises:
    a first ferromagnetic layer made with PMA (Perpendicular Magnetic Anisotropy) on to the barrier layer;
    a non-magnetic layer disposed on the first ferromagnetic layer; and
    a second ferromagnetic layer made with PMA on the non-magnetic layer.

9. A racetrack magnetic memory device, comprising:
    a substrate, wherein the substrate comprises a registration layer and a barrier layer disposed on the registration layer;
    a sensing block which is patterned to distribute on the barrier layer; and
    a repair layer disposed at least on the barrier layer and the registration layer which is configured to store data, wherein the barrier layer is configured to have a tunneling effect when a bias voltage exists between the sensing block and the registration layer, and the oxygen concentration in the barrier layer is lowered after coming in contact with the repair layer,
    wherein the repair layer comprises metal oxide.

10. The racetrack magnetic memory device of claim 9, wherein the repair layer is a multiple-layered structure.

11. The racetrack magnetic memory device of claim 9, wherein the registration layer possesses a standard oxidation potential value, $E_b$, and the repair layer possesses a standard oxidation potential value, $E_r$, wherein $E_r$ is greater than $E_b$.

12. The racetrack magnetic memory device of claim 11, wherein $E_r$ is greater than 0.44 volt.

13. The racetrack magnetic memory device of claim 9, wherein the repair layer comprises metal or metal alloy.

14. The racetrack magnetic memory device of claim 13, wherein the repair layer comprises Mg, Al, Ti, Mn, Zn, Cr, Ta, or the combination thereof.

15. The racetrack magnetic memory device of claim 9, wherein the metal oxide comprises all possible oxidation states of the following metals: Mg, Al, Ti, Mn, Zn, Cr, and/or Ta, or the combination thereof.

16. The racetrack magnetic memory device of claim 9, wherein the sensing block comprises:
    a first ferromagnetic layer made with PMA (Perpendicular Magnetic Anisotropy) on the barrier layer;
    a non-magnetic layer disposed on the first ferromagnetic layer; and
    a second ferromagnetic layer made with PMA on the non-magnetic layer.

* * * * *